United States Patent [19]

Lillig

[11] 4,270,178
[45] May 26, 1981

[54] MEASURING SYSTEM INCORPORATING SELF-TESTING PROBE CIRCUIT AND METHOD FOR CHECKING SIGNAL LEVELS AT TEST POINTS WITHIN THE SYSTEM

[75] Inventor: John E. Lillig, Diamond Bar, Calif.

[73] Assignee: Beckman Instruments, Inc., Fullerton, Calif.

[21] Appl. No.: 94,267

[22] Filed: Nov. 14, 1979

Related U.S. Application Data

[63] Continuation of Ser. No. 816,997, Jul. 19, 1977, abandoned.

[51] Int. Cl.³ ............................................... G01R 31/00
[52] U.S. Cl. ................................. 364/579; 324/73 R; 364/481; 364/580; 371/15; 371/25
[58] Field of Search .................................... 371/15, 25; 364/496–498, 550–555, 525, 579, 580, 480–486; 324/73 R, 73 AT

[56] References Cited

U.S. PATENT DOCUMENTS

| | | | |
|---|---|---|---|
| 3,739,160 | 6/1973 | El-Hasan et al. | 371/25 |
| 3,790,767 | 2/1974 | Alexander | 364/486 |
| 3,835,701 | 9/1974 | Murphy et al. | 364/551 |
| 4,035,621 | 7/1977 | Kemp | 364/551 |
| 4,044,244 | 8/1977 | Foreman et al. | 324/73 R |

*Primary Examiner*—Errol A. Krass
*Attorney, Agent, or Firm*—R. J. Steinmeyer; Robert R. Meads; John R. Shewmaker

[57] ABSTRACT

In a system which measures a parameter of a sample and displays information relating thereto, a circuit including the component elements of the system for testing signal levels at test points within the system and for displaying the test signal levels. Switching means places the system in either a transducing mode for measuring the parameter or in a combined transducing/self-testing mode for simultaneous testing during transducing operation. The testing circuit includes an operator manipulated probe for contacting any of the test points and an analog multiplexer input of the system for multiplexing the probe test signal and the transducing signal. The multiplexed signals are converted to digital form and processed by the system's computer for display. In the combined transducing/self-testing mode, the probe test signal information is outputted to the system display while the transducing output thereto is inhibited. The transducing output information derived during testing is processed and stored by the computer for subsequent display.

3 Claims, 2 Drawing Figures

MEASURING SYSTEM INCORPORATING SELF-TESTING PROBE CIRCUIT AND METHOD FOR CHECKING SIGNAL LEVELS AT TEST POINTS WITHIN THE SYSTEM

This is a continuation, of application Ser. No. 816,997, filed July 19, 1977 and now abandoned.

BACKGROUND OF THE INVENTION

Field of the Invention

The present invention relates to the testing of signal levels within a measuring system and, more particularly, to built-in, self-testing circuitry for checking signal levels at system test points during normal system operation.

With the advent of present day advances in mircro-processor and software technology, many measuring and analytical instruments such as spectrophotometers, liquid scintillation counters, light scattering photometers, and the like are incorporating processors of this nature for processing and measuring information derived by the measuring instrument. The instruments are typically designed to perform sophisticated analysis of clinical, biological, or other samples for laboratories, hospitals and the like. As the complexity of such instruments increases, it is evident that an instrument manufacturer must provide the requisite backup technical support to a user to advise the user regarding instrument operation and to diagnose and remedy malfunctions in instrument operation.

The cost of providing skilled technical support and repair personnel can be high, and for this reason it is desirable to derive an instrument design which enables a relatively unskilled operator or user to perform at least limited trouble-shooting on the instrument with minimal assistance from the instrument manufacturer. For example, the source of a malfunction can often be traced by simply checking signal levels at various test points strategically located within the circuitry of the system. If the user could test these signal levels, then the user might isolate the problem and be able to correct it. If assistance is needed, the user could provide the test results to the manufacturer by telephone and receive corrective instructions without the need for a service visit by the manufacturer. However, even if a service visit were required, providing the test results to the manufacturer ahead of time would enable the service representative to accurately diagnose the problem and bring the necessary components and equipment for repair.

Troubleshooting and instrument in the foregoing manner obviously requires a voltmeter or other signal measuring device. This presents a practical difficulty since many instrument users simply do not have, or cannot justify the expense of acquiring, a separate voltmeter for infrequent use in troubleshooting an instrument.

Because of this limited user capability, some instruments have been designed with a built-in voltmeter feature. With this approach, a plurality of leads are hard wired to preselected test points in the system circuitry. A multi-position switch, usually hand operated, is provided to connect respective leads in succession to a built-in voltmeter, and the voltmeter reading for each is displayed. While this approach does provide valuable diagnostic information, it exhibits several drawbacks which reduce its overall usefulness. First, when the test operations are being performed, the normal measuring operation of the system is disabled. For example, if the system normally measures a changing optical or electrical characteristic of a chemical reaction between sample materials, this measuring function is not conducted during the diagnostic test procedure. However, often a system malfunction is apparent only during an actual measuring operation. In such case it would be mandatory to test signal levels during the measuring operation to isolate at what point during a measurement and in what manner the malfunction occurs. This is not possible with the foregoing system.

Another disadvantage of the foregoing system resides in the limited number of test points which can be tested. Hard wiring the test leads between the pre-selected test points and the multi-position switch precludes an operator from checking any but the hard wired test points.

SUMMARY OF THE INVENTION

The present invention resides in a built-in, self-testing method and circuit for a measuring system which overcomes the difficulties associated with prior testing of such systems. The testing circuit eliminates the need for a separate and external signal measuring device (voltmeter), enables signal levels at test points of the measuring system to be tested during an actual measurng operation, and provides testing flexibility enabling an operator to select any circuit point for test.

To these ends, the circuit for implementing the method of the invention is included as part of a system for measuring a parameter of a sample. The system includes transducing means for monitoring the parameter and generating an analog signal in response thereto, an analog-to-digital converter for converting the signal to digital form, computer means for operating on the digital signal to generate an output digital signal providing information regarding the measured parameter, and means for displaying the output signal. In accordance with a primary aspect of the invention, switching means is provided to switch the system to either a transducing mode for measuring the parameter or a combined transducing/self-testing mode for simultaneously (1) measuring the parameter and (2) testing signal levels at any test point within the system. To this end, the self-testing means of the invention comprises a probe having a sensing element for contacting a test point, an analog multiplexer receiving at one input terminal thereof the test signal from the probe and receiving at another input terminal thereof the transducing signal. The multiplexer supplies to the analog-to-digital converter an output multiplexed signal containing both transducing signal information and probe signal information. Significantly, the computer means processes both the transducing signal and probe signal information. Control means associated with the computer means responds to the switching means in the transducing/self-testing position for outputting the probe signal to the display and for simultaneously inhibiting the output of the transducing signal thereto. The system continues to process the transducing signal information and stores it, as necessary, for subsequent display when the switching means returns the system to the transducing mode.

With the foregoing arrangement, the system components for measuring and processing the transducing signal of the sample parameter are likewise employed to measure and process the probe test point signals within the same system. This measurement is performed while the actual transducing operation continues enabling the system to be tested during its normal operation. The probe signal information is displayed to the operator during the testing operation; however, the transducing signal information derived during this period is processed in normal manner by the computer and stored for later display. In this manner, desired information regarding the measured parameter is not lost during signal level testing of the instrument. The foregoing self-testing circuit provides a diagnostic tool which enables an instrument user to perform diagnostic testing of any system test point. The testing circuit can be incorporated in a system at a minute additional cost. It eliminates any need for external voltmeters and provides greater overall flexibility in use than do prior built-in testers.

DESCRIPTION OF THE PREFERRED EMBODIMENT

Figure 1:
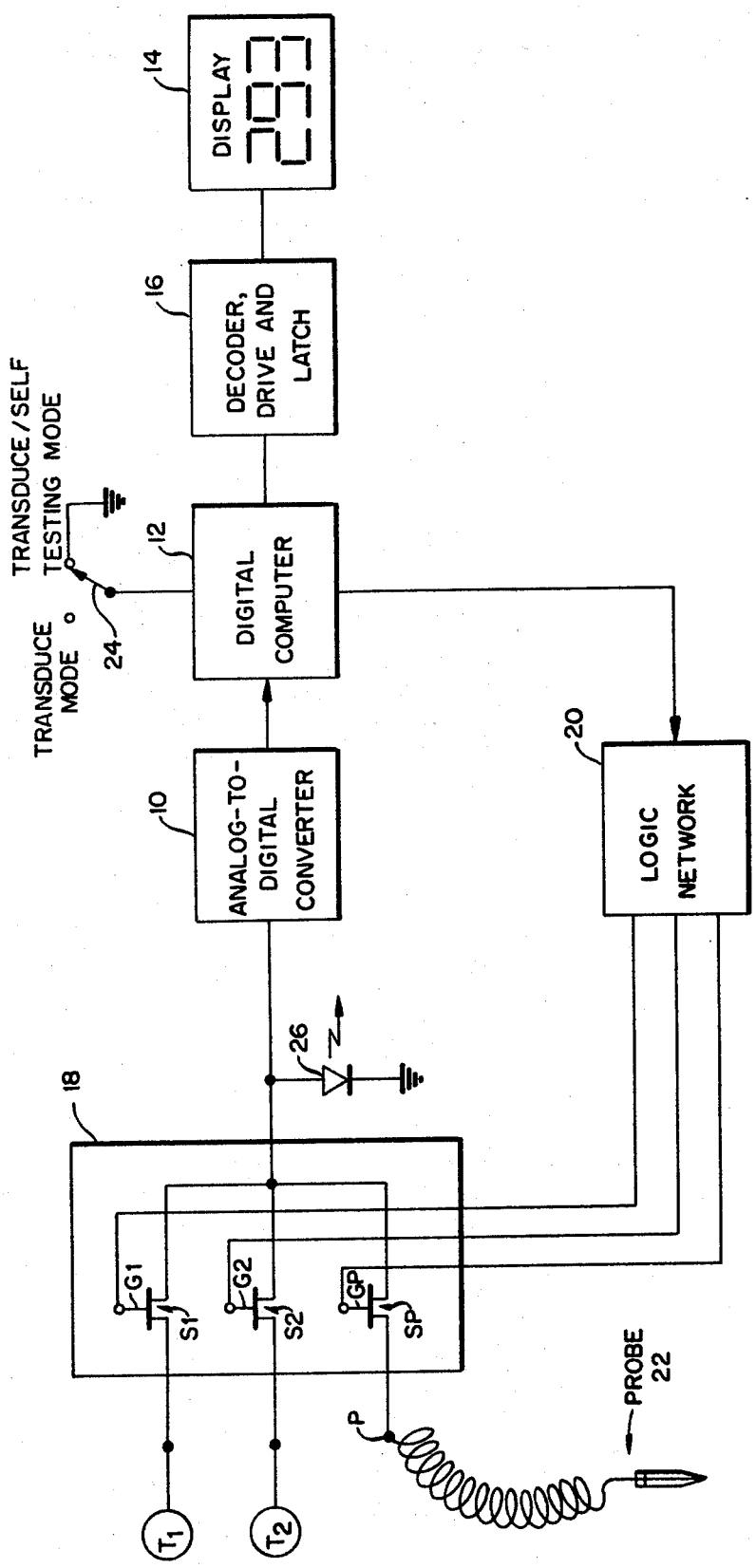
FIG. 1 is a combined block and schematic diagram of a measuring system incorporating the built-in, self-testing circuitry of the present invention.

Referring now to the drawings, FIG. 1 illustrates a signal measuring system incorporating the self-testing circuit of the present invention. The measuring system itself is conventional in design and may include (1) one or more transducers T1, T2, . . . each for measuring a parameter of a sample and generating an analog signal in response thereto, (2) an analog-to-digital converter 10 for converting the analog signal to digital form, (3) a digital microcomputer or other processing device 12 for processing the digital information from A-to-D converter 10, (4) a decode and drive circuit 16 for receiving digital information processed by the computer and (5) a display 14 coupled to the drive circuit 16 to display the digital information. For example, copending application Ser. No. 796,621 (Anderson et al.), assigned to the assignee of the present invention, describes a system for making rate nephelometric measurements illustrative of such an overall system. In that application, a photomultiplier tube continuously monitors light scattered by precipitate formed during an antigen-antibody reaction to transduce the scattered light signal for processing and display by the system as a measure of an antigen or antibody reaction component.

In such a system, where more than one transducer is employed for monitoring several parameters or where several analog signals are to be converted to digital form, an analog multiplexer 18 is provided to combine the analog signal into a multiplexed output signal. As is well understood in the art, such a multiplexer has a plurality of input terminals each receiving a corresponding analog input signal and a single output terminal for supplying an output signal containing multiplexed information for all input signals. Each input terminal is connected to the output terminal through a device corresponding to one of switching devices S1, S2, . . . , such as junction field effect transistors. Such transistors are rendered conductive by an appropriate enabling control signal supplied to a gate electrode G1, G2, . . . thereof. The switching devices are rendered momentarily conductive in succession. For this purpose, a logic network 20, responsive to computer 12, supplies enabling pulses to the transistor gate electrodes in succession to turn on each transistor momentarily and hence sample each analog input signal in succession.

The multiplexed analog output from multiplexer 18 is converted to digital form by analog-to-digital converter 10 and coupled to the input of computer 12 for de-multiplexing and processing. The computer, in the preferred embodiment, is a commercially available Intel 8080 microprocessor based digital microcomputer. The details of the computer are well known in the art and form no part of the present invention. In general, however, such general purpose computers include a central processing unit, a programmed sequence of memory instructions (a read only memory), an uncommitted block of usable memory (a read/write memory), and various input and output interfacing capabilities. Instructions can be executed from the read only memory. Data can be transferred into or out of the read/write memory and into or out of the central processing unit. The central processing unit is configured to fetch and/or execute data and/or instructions to and/or from the memories and to the various input and output control devices. Programming such a computer for automating instrument control and operation, and coordinating information processing is straightforward and well established in the art.

Computer 12 supplies an encoded digital output signal to the digital decoder and driver 16. The decoder, in conventional fashion, decodes the output signal into a form acceptable to display 14 and latches this value in an associated display memory. With the digital signal latched in circuitry 16, it is unnecessary for the computer to refresh the display content in circuitry 16 until a new value is to be displayed.

In accordance with a primary aspect of the present invention, the built-in, self-testing circuitry of the present invention includes a conventional signal sensing probe 22 having a sensing end for contacting any of various test points in the system and an opposite end connected physically and electrically to the probe input terminal P of analog multiplexer 18. The probe may be a wire conductor of appropriate length to reach all system test points. In this manner, an operator may place the free end of the probe in electrical contact with any test point to derive a test signal level as an input signal to the analog multiplexer. Input terminal P is connected to the multiplexer output terminal through a corresponding field effect transistor $S_P$ the gate electrode $G_P$ of which receives a control signal from logic network 20.

The test circuitry further includes a two position switch 24, controlled by an operator, to switch the system into either (1) a transducing mode for processing transducing measurements or (2) a combined transducing/self-testing mode in which simultaneously with the transducing measurements, probe test signals are derived via probe 22 at any desired circuit test point, processed, and displayed by display 14.

When the switch 24 is placed in the combined transducing/self-testing mode, the central processor in computer 12 recognizes the switch position and read only memory instructions in computer 12 cause the computer to output the test signal now being inputted from probe 22 to display 14 while inhibiting output to the display of the transducing signal from the measured physical parameter. Consequently, the voltage level measured by the probe is displayed by display 14, and as the operator moves the probe from one test point to another each new test point voltage is displayed.

Significantly, the overall system is also enabled for normal transducer operation during the self-testing procedure, and computer 12 processes information derived from the transducers in a normal fashion during this time. Use is made of the read/write memory in the computer and if information is derived regarding the measured parameter which would otherwise be immediately displayed, it is transferred into a memory location for later retrieval and display when switch 24 is returned to the measuring mode position. For example, in the nephelometer of the foregoing copending patent application, computer 12 processes the scattered light signal to determine the maximum rate of change of such signal. If such a determination is made during a self-testing procedure, the maximum rate of change information is stored temporarily for later retrieval and display so that the information is not lost. The ongoing chemical reaction in the antigen-antibody reaction container and its measurement are not interrupted during testing and the measured result is always saved for subsequent recording. Moreover, switch 24 may be switched back and forth between its two positions without interrupting measurement of the reaction.

To provide additional logic signal sensing flexibility a threshold detecting device 26, such as a light emitting diode, is connected between the output terminal of multiplexer 18 and ground to provide a "high" or "low" indication of the logic signal level at a test point. For example, if such high and low levels are five and zero volts, respectively, then the diode 26 is selected with an intermediate threshold level, for example three volts. In this manner, the diode will be either illuminated or not depending on the "high" or "low" condition of a test point to which probe 22 is connected.

Figure 2:
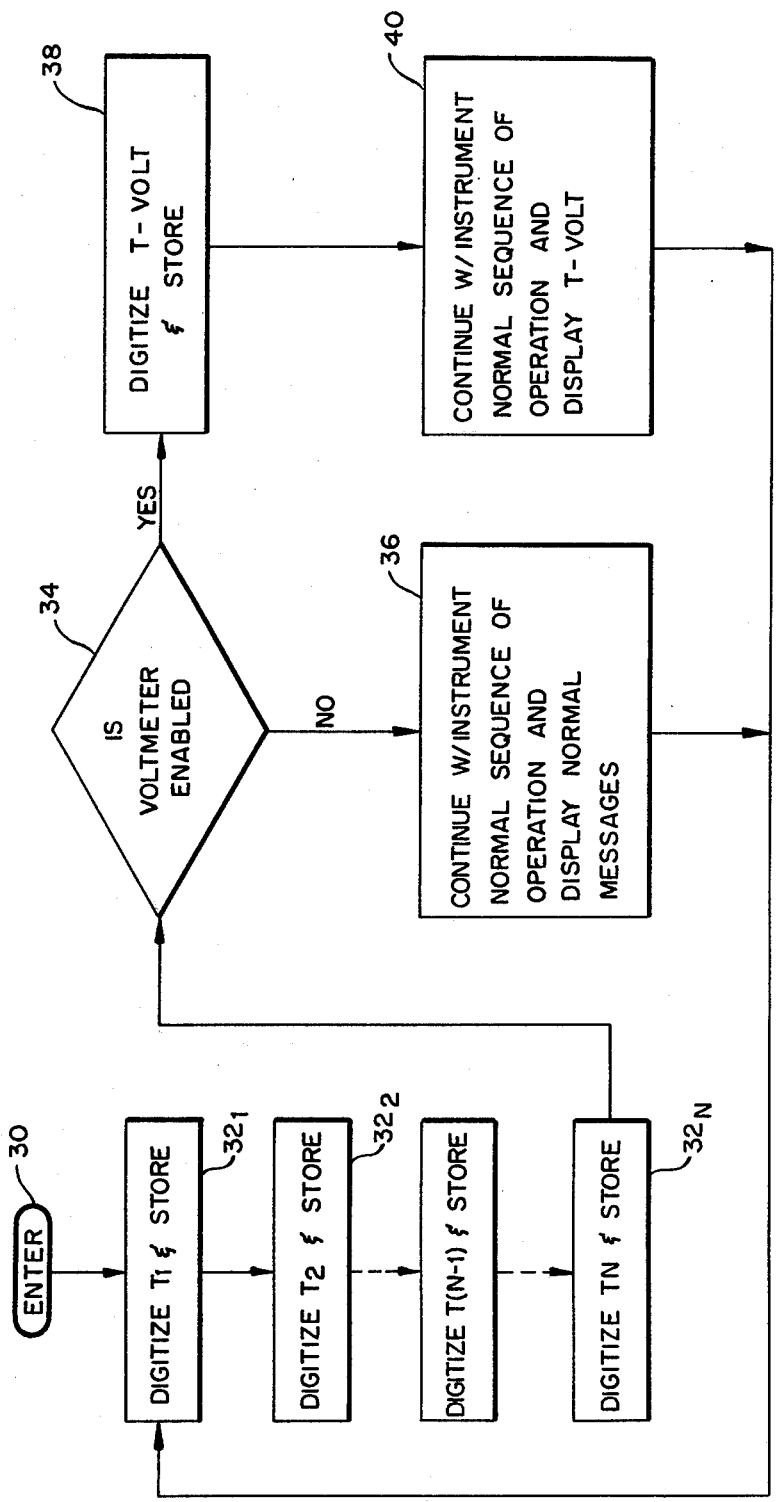
FIG. 2 is a flow chart showing in method steps the logic implemented by the system for controlling both measuring and testing operations.

FIG. 2 illustrates the flow diagram of the method performed by the present system. The flow chart is entered at 30 and the signal from each transducer T1, T2, . . . is digitized and stored in read/write memory at $32_{1-N}$. After each input has been sampled and stored, the question is posed at 34 whether the voltmeter operation is enabled. If the answer is "no", then at step 36 instruction is made to continue with normal operation and sequencing of the instrument. If the answer is "yes" that the voltmeter is enabled, then the test signal information is additionally digitized and stored at 38. Subsequently, at step 40 normal instrument operation continues except for the fact that the test voltage signal is displayed and the transducing signal is processed but not displayed.

The foregoing flow chart is exceedingly simple, and the Intel 8080 based digital microcomputer can be simply and easily programmed by a programmer skilled in the art to execute the steps of the flow chart.

It will be apparent from the foregoing that the testing method and apparatus of the invention simplifies system troubleshooting enabling an operator to select any circuit point for test without the need for external test equipment. The circuitry utilizes existing system components for implementing the testing method. The system may be switched between its transducing and its combined transducing/self-testing modes without interrupting a transducing operation or otherwise destroying information generated by the transducing operation. Consequently, the system may be tested and the test point signals displayed during a transducing operation, and the transducing information can then be returned from storage for display after testing is completed.

While the system has been disclosed for multiplexing transducing signal information and test probe information, it will also be apparent that the transducing signal information could be supplied as a computer-generated, simulated analog transducing input signal, as disclosed in my concurrently filed application Ser. No. 816,996 and now abandoned, in which case the probe signal would be multiplexed with the simulated analog transducing input signal, and transducing signal as used herein includes such a simulated signal.

Moreover, it will be apparent that while a preferred embodiment of the invention has been illustrated and described, various modifications may be made therein without departing from the spirit and scope of the invention as defined by the appended claims.

What is claimed is:

1. In a system for measuring a sample parameter and including transducing means for monitoring said parameter and generating an analog signal in response thereto, an analog-to-digital converter for converting said analog signal to digital form, computer means operating on said digital signal to generate an output digital signal providing information regarding said parameter, said computer means including storage capacity for storing information regarding said parameter, and means for displaying said output digital signal, improved means for self-testing signal levels at test points within said system comprising:

a probe having a signal sensing element on one end adapted to be placed in contact with any of said test points;

an analog multiplexer having a plurality of input terminals and an output terminal, said output terminal connected to said analog-to-digital converter;

means connecting the other end of the probe to one input terminal of said analog multiplexer to supply a probe signal thereto, said probe as connected to said one input terminal being of a length enabling it to be manipulated to place the signal sensing element on said one end thereof in contact with any of said test points within said system;

means coupling said transducing means to another input terminal of said analog multiplexer to supply said transducing signal thereto;

logic means controlling said analog multiplexer to multiplex the input signals thereto and hence to supply a multiplexed signal containing both transducing and probe signal information to said analog-to-digital converter for conversion and supply to said computer means, said computer means for de-multiplexing said multiplexed signal and processing both said transducing signal and said probe signal information;

switching means connected to said computer means for switching said system to either (1) a transducing mode for measuring said parameter or to (2) a combined transducing/self-testing mode for measuring both said parameter and said test point signal levels; and control means in said computer means and responsive to said switching means for outputting said probe signal to said displaying means and for simultaneously inhibiting the outputting of said transducing signal thereto, said computer means, while said probe signal is displayed, continuing to process and store said transducing signal information for subsequent retrieval and display when said switching means returns said system to said transducing mode.

2. The system of claim 1 further including:
threshold detecting means connected to the output of said analog multiplexer for indicating the logic state of the signal level at a test point.

3. A method of testing signal levels at test points within a measuring system of the type which measures a sample parameter and includes transducing means for monitoring said parameter and generating an analog signal in response thereto, an analog-to-digital converter for converting said analog signal to digital form, computer means operating on said digital signal to generate an output digital signal providing information regarding said parameter, where said computer means includes storage capacity for storing information regarding said parameter, and means for displaying said output digital signal, said method of testing comprising the steps of:

contacting a test point of said measuring system with a testing element of a test probe to derive an analog signal indicative of the signal level at said test point;

multiplexing the transducing analog signal indicative of said sample parameter and the analog signal indicative of said test probe signal level to derive an output multiplexed signal containing both transducing signal and probe signal information;

converting said output multiplexed signal into digital form for coupling to said computer means for processing both said transducing signal and said probe signal information; and outputting said probe signal from said computer means to said displaying means while simultaneously inhibiting the outputting of said transducing signal thereto, and, while said probe signal is displayed, processing and storing any transducing signal information for subsequent retrieval and display.

* * * * *